United States Patent [19]

Nath et al.

[11] Patent Number: 4,462,332
[45] Date of Patent: Jul. 31, 1984

[54] MAGNETIC GAS GATE

[75] Inventors: Prem Nath, Troy; David A. Gattuso, Pontiac, both of Mich.

[73] Assignee: Energy Conversion Devices, Inc., Troy, Mich.

[21] Appl. No.: 372,937

[22] Filed: Apr. 29, 1982

[51] Int. Cl.³ .............................................. C23C 13/10
[52] U.S. Cl. ..................................... 118/718; 118/719; 118/733; 118/900; 277/80; 414/217; 34/242
[58] Field of Search ................. 118/718, 50, 719, 900, 118/733, 729; 427/47, 255.5; 277/3, 80, 53; 34/242; 414/217, 292

[56] References Cited

U.S. PATENT DOCUMENTS

| 3,227,132 | 1/1966 | Clough et al. | 118/733 |
| 3,645,545 | 2/1972 | Garnache et al. | 118/229 X |
| 3,648,383 | 3/1972 | Saunders | 34/242 |
| 3,893,876 | 7/1975 | Akai et al. | 118/729 X |
| 4,346,669 | 8/1982 | Hill | 118/733 |
| 4,389,970 | 6/1983 | Edgerton | 118/725 X |

FOREIGN PATENT DOCUMENTS

| 2008162 | 5/1979 | United Kingdom | 118/233 |
| 2083840 | 3/1982 | United Kingdom | 118/718 |

Primary Examiner—John D. Smith
Assistant Examiner—Bernard F. Plantz
Attorney, Agent, or Firm—Marvin S. Siskind; Ronald W. Citkowski

[57] ABSTRACT

A magnetic gas gate adapted to operatively connect two adjacent dedicated chambers, in the first chamber of which a first layer is deposited upon a magnetic web of substrate material and in the second chamber of which a second layer is deposited onto the first layer. The first chamber has introduced thereinto gas constituents used to form the first layer while the second chamber (1) has introduced thereinto gas constituents used to form the second layer which constituents include at least one gas not introduced into the first chamber; and (2) is operatively associated with a mechanism for unidirectionally drawing the gases from the first chamber side of the gas gate toward the second chamber side of the gas gate. It is important that the second chamber gas constituents be substantially prevented from backflowing or diffusing through the gas gate to contaminate the gas constituents in the first chamber. To prevent contamination of the first chamber constituents from the second chamber gas constituents, the present invention substantially reduces the size of the passageway through the gas gate by creating a magnetic field adapted to urge the unlayered surface of the magnetic substrate into sliding contact with one of the walls of the passageway. Since the size of the gas gate passageway is reduced, the backflow of gas constituents from the second chamber is correspondingly reduced, thereby providing for the production of a more efficient product. The magnetic gas gate of the present invention provides the additional benefit of reducing warpage of the magnetic web of substrate material which also results in the production of a more efficient product.

13 Claims, 5 Drawing Figures

MAGNETIC GAS GATE

FIELD OF THE INVENTION

This invention relates generally to apparatus for producing photovoltaic devices and more particularly to an improved magnetic gas gate operatively connecting adjacent deposition chambers so as to (1) decrease contamination of one deposition chamber caused by the backflow of gases from the adjacent deposition chamber, and (2) substantially reduce waffling of the substrate material.

BACKGROUND OF THE INVENTION

This invention relates to apparatus for continuously producing photovoltaic devices on a web of magnetic substrate material by depositing successive amorphous-silicon alloy semiconductor layers in each of at least two adjacent deposition chambers. The composition of each amorphous layer is dependent upon the particular reaction gas constituents introduced into each of the deposition chambers. The constituents introduced into the first deposition chamber are carefully controlled and isolated from the constituents introduced into the adjacent deposition chamber. More particularly, the deposition chambers are operatively connected by a relatively narrow gas gate passageway (1) through which the web of substrate material passes; and (2) adapted to isolate the reaction gas constituents introduced into the first deposition chamber from the reaction gas constituents introduced into the adjacent deposition chamber. However, it has been determined that despite the relatively small size of the gas gate passageway, dopant gas constituents introduced into the second deposition chamber backflow or diffuse into the adjacent first deposition chamber, thereby contaminating the layer deposited in said first deposition chamber. It is the essence of the present invention to reduce the size of the passageway in the gas gate which serves to correspondingly reduce the backflow or diffusion of dopant gas constituents, thereby decreasing the contamination of the layer deposited in the first deposition chamber.

Recently, considerable efforts have been made to develop processes for depositing amorphous semiconductor alloys, each of which can encompass relatively large areas, and which can be doped to form p-type and n-type materials for the production of p-i-n-type devices substantially equivalent to those produced by their crystalline counterparts. For many years such work with amorphous silicon or germanium films was substantially unproductive because of the presence therein of microvoids and dangling bonds which produce a high density of localized states in the energy gap. Initially, the reduction of the localized states was accomplished by glow discharge deposition of amorphous silicon films wherein silane ($SiH_4$) gas is passed through a reaction tube where the gas is decomposed by a radio frequency (r.f.) glow discharge and deposited on a substrate at a substrate temperature of about 500–600 degrees K. (227–327 degrees C.). The material so deposited on the substrate is an intrinsic amorphous material consisting of silicon and hydrogen. To produce a doped amorphous material, phosphine gas ($PH_3$), for n-type conduction, or diborane ($B_2H_6$) gas, for p-type conduction is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to substantially reduce the density of the localized states in the energy gap, thereby causing the amorphous material to more nearly approximate the corresponding crystalline material.

It is now possible to prepare greatly improved amorphous silicon alloys, that have significantly reduced concentrations of localized states in the energy gaps thereof, while providing high quality electronic properties by glow discharge. This technique is fully described in U.S. Pat. No. 4,226,898, Amorphous Semiconductors Equivalent to Crystalline Semiconductors, Stanford R. Ovshinsky and Arun Madan which issued Oct. 7, 1980 and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor operates to substantially reduce the density of the localized states therein and facilitates the addition of other alloying materials, such as germanium.

Activated fluorine readily diffuses into, and bonds to, amorphous silicon in a matrix body to substantially decrease the density of localized defect states therein. This is because the small size of the fluorine atoms enables them to be readily introduced into an amorphous silicon matrix. The fluorine bonds to the dangling bonds of the silicon and forms a partially ionic stable bond with flexible bonding angles, which results in a more stable and more efficient compensation or alteration than could be formed by hydrogen, or other compensating or altering agents which were previously employed. Fluorine is considered to be a more efficient compensating or altering element than hydrogen when employed alone or with hydrogen, because of its exceedingly small size, high reactivity, specificity in chemical bonding, and having highest electronegativity.

Compensation may be achieved with fluorine, alone or in combination with hydrogen, upon the addition of such element(s) in very small quantities (e.g., fractions of one atomic percent). However, the amounts of fluorine and hydrogen most desirably used are much greater than such small percentages, permitting the elements to form a silicon-hydrogen-fluorine alloy. Thus, alloying amounts of fluorine and hydrogen may, for example, be used in a range of 0.1 to 5 percent or greater. The alloy thus formed has a lower density of defect states in the energy gap than can be achieved by the mere neutralization of dangling bonds and similar defect states. In particular, it appears that use of larger amounts of fluorine participates substantially in effecting a new structural configuration of an amorphous silicon-containing material and facilitates the addition of other alloying materials, such as germanium. Fluorine, in addition to the aforementioned characteristics, is an organizer of local structure in the silicon-containing alloy through inductive and ionic effects. Fluorine, also influences the bonding of hydrogen by acting to decrease the density of the defect states which hydrogen normally contributes. The ionic role that fluorine plays in such an alloy is an important factor in terms of the nearest neighbor relationships.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is increased without substantially decreasing the short circuit current.

Many publications on crystalline stacked cells following Jackson have been reported and, more recently, several articles dealing with Si-H materials in stacked cells have been published. Marfaing proposed utilizing silane deposited amorphous Si-Ge alloys in stacked cells, but did not report the feasibility of doing so. (Y. Marfaing, Proc. 2nd European) Communities Photovoltaic Solar Energy Conf., Berlin, West Germany, p. 287, (1979).

Hamakawa et al., reported the feasibility of utilizing Si-H in a configuration which will be defined herein as a cascade type multiple cell. The cascade cell is hereinafter referred to as a multiple cell without a separation or insulating layer therebetween. Each of the cells was made of an Si-H material of the same band gap in a p-i-n junction configuration. Matching of the short circuit current ($J_{sc}$) was attempted by increasing the thickness of the cells in the serial light path. As expected, the overall device Voc. increased and was proportional to the number of cells.

In a recent report on increasing the cell efficiency of multiple-junction (stacked) solar cells of amorphous silicon deposited from silane in the above manner, it was reported that "(g)ermanium has been found to be a deleterious impurity in Si:H, lowering its $J_{sc}$ exponentially with increasing Ge . . . " From their work, as well as the work of Carlson, Marfaing and Hamakawa, they concluded that alloys of amorphous silicon, germanium and hydrogen "have shown poor photovoltaic properties" and thus new "photovoltaic film cell materials must be found having spectral response at about 1 micron for efficient stacked cell combinations with a Si:H." (J. J. Hanak, B. Faughnan, V. Korsun, and J. P. Pellican, presented at the 14th IEEE Photovoltaic Specialists Conference, San Diego, Calif., Jan. 7–10, 1980).

Due to the beneficial properties attained by the introduction of fluorine, amorphous alloys used to produce cascade type multiple cells now incorporate fluorine to reduce the density of localized states without impairing the electronic properties of the material. Further band gap adjusting element(s), such as germanium and carbon, can be activated and are added in vapor deposition, sputtering or glow discharge processes. The band gap is adjusted as required for specific device applications by introducing the necessary amounts of one or more of the adjusting elements into the deposited alloy cells in at least the photocurrent generation region thereof. Since the band gap adjusting element(s) has been tailored into the cells without adding substantial deleterious states, because of the influence of fluorine, the cell alloy maintains high electronic qualities and photoconductivity when the adjusting element(s) are added to tailor the device wavelength characteristics for a specific photoresponse application. The addition of hydrogen, either with fluorine or after deposition, can further enhance the fluorine compensated or altered alloy. The post deposition incorporation of hydrogen is advantageous when it is desired to utilize the higher deposition substrate temperatures allowed by fluorine.

It is of obvious commercial importance to be able to mass produce photovoltaic devices. Unlike crystalline silicon which is limited to batch processing for the manufacture of solar cells, amorphous silicon alloys can be deposited in multiple layers over large area substrates to form solar cells in a high volume, continuous processing system. Continuous processing systems of this kind are disclosed, for example, in pending patent applications Ser. No. 151,301, filed May 19, 1980 for A Method of Making P-Doped Silicon Films and Devices Made Therefrom; Ser. No. 244,386, filed Mar. 16, 1981 for Continuous Systems For Depositing Amorphous Semiconductor Material; Ser. No. 240,493, filed Mar. 16, 1981 for Continuous Amorphous Solar Cell Production System; Ser. No. 306,146, filed Sept. 28, 1981 for Multiple Chamber Deposition and Isolation System and Method; and Ser. No. 359,825, filed Mar. 19, 1982 for Method And Apparatus For Continuously Producing Tandem Amorphous Photovoltaic Cells. As disclosed in these applications, a substrate may be continuously advanced through a succession of deposition chambers, wherein each chamber is dedicated to the deposition of a specific material. In making a solar cell of p-i-n-type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy. Since each deposited alloy, and especially the intrinsic alloy must be of high purity, the deposition environment in the intrinsic deposition chamber is isolated from the doping constituents within the other chambers to prevent the diffusion of doping constituents into the intrinsic chamber. In the previously mentioned patent applications, wherein the systems are primarily concerned with the production of photovoltaic cells, isolation between the chambers is accomplished either by employing gas gates which pass or "sweep" an inert gas about the substrate as it passes therethrough; or by gas gates which establish unidirectional flow of the reaction gas mixture introduced into the intrinsic deposition chamber into the dopant deposition chambers. The improved magnetic gas gate of the present invention results in a reduced passageway between chambers which effects a substantial decrease in (1) contaminants diffusing or backflowing from the dopant deposition chambers to the intrinsic deposition chamber, and (2) waffling of the substrate material, thereby reducing scratching of the substrate and aiding in the production of more efficient photovoltaic devices. It should be noted that other chambers may be operably connected to the amorphous layer deposition chambers. For example, a chamber in which the transparent conductive oxide layer (discussed hereinafter) is added atop the uppermost amorphous alloy layer may be operatively connected to the final deposition chamber. Since it would be obviously undesirable to have (1) constituents from the transparent conductive oxide chamber backflow or diffuse into the dopant chamber, and (2) the substrate material waffle in the transparent conductive oxide chamber, the magnetic gas gate of the present invention would also be employed between the transparent conductive oxide and the final dopant deposition chamber. For that matter, the magnetic gas gate would preferably be employed between all chambers of the apparatus which are operatively connected for continuously producing amorphous photovoltaic devices.

The many objects and advantages of the present invention will become clear from the drawings, the detailed description of the invention and the claims which follow.

BRIEF SUMMARY OF THE INVENTION

Disclosed herein is an improved gas gate for substantially reducing the backflow of reaction gas constituents from one of a pair of adjacent isolated deposition chambers to the other of the pair. The gas gate is of the general type which includes a relatively narrow passageway through which a substrate moves from the first of the adjacent deposition chambers wherein a first layer is deposited onto one side of said substrate to the second of said deposition chambers wherein a second layer is deposited atop the first layer. The passageway is defined by elongated upper and lower walls and relatively short side walls. The first deposition chamber includes a first conduit through which at least one reaction gas constituent is introduced adjacent the plasma region and the second deposition chamber also includes a conduit through which at least one additional reaction gas constituent, not introduced into the first deposition chamber, is introduced adjacent the plasma region. The first deposition chamber is further provided with a second conduit at the passageway entrance for introducing hydrogen, argon or another inert sweep gas at the front end of the gas gate. An evacuating pump is operatively associated with each of the deposition chambers. The first chamber pump is adapted to remove substantially all of the at least one reaction gas constituent introduced into the plasma region thereof. The second chamber pump is adapted to remove substantially all of the at least one additional reaction gas constituent, introduced into the plasma region thereof. A second evacuating pump may be located adjacent the rear end of the gas gate for withdrawing the sweep gases.

The gas gate is improved by the addition of a mechanism adapted to urge the unlayered side of a magnetically attractive substrate traveling through the passageway, without physically contacting the layered side of the substrate, into sliding contact with one of the upper and lower passageway walls so that the distance between the upper and lower passageway walls may be decreased without having the layered substrate surface contact the other of the upper and lower passageway walls. The decreased passageway opening results in reduced backflow of reaction gas constituents from the second deposition chamber into the adjacent first deposition chamber.

Preferably, the passageway wall which contacts the magnetic substrate is a low friction and low thermal conductivity borosilicate glass sheet. The substrate is fabricated from a magnetic material and is urged into sliding contact with the glass sheet by a magnetic field established by a plurality of ceramic magnets which are separated from one another by a plurality of non-magnetic spacers.

These and other objects and advantages of the present invention will become apparent from the drawings, the claims and the detailed description of the invention which follows.

DETAILED DESCRIPTION OF THE DRAWINGS

I. The Photovoltaic Cell

Figure 1:
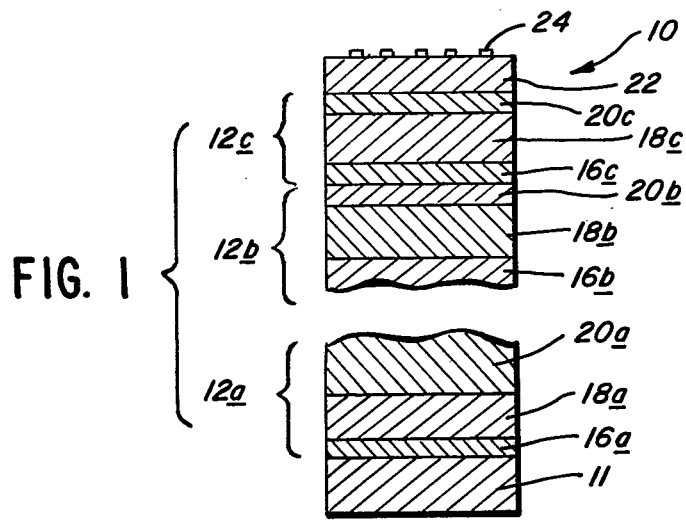
FIG. 1 is a fragmentary, cross-sectional view of a tandem or cascade photovoltaic device comprising a plurality of p-i-n-type cells, each layer of the cells formed from an amorphous, semiconductor alloy in accordance with the principles of the present invention.

Referring now to the drawings and particularly to FIG. 1, a tandem or cascade-type photovoltaic cell, formed of successive p-i-n layers each including an amorphous semiconductor alloy, is shown generally by the numeral 10. It is for the production of this type of photovoltaic device, wherein amorphous alloy layers are continuously deposited onto a moving web of substrate material in successive isolated deposition chambers, that the improved gas gates of the present invention were developed.

More particularly, FIG. 1 shows a plurality of p-i-n-type photovoltaic devices such as solar cells 12a, 12b and 12c. Below the lowermost cell 12a is a substrate 11 which may be transparent or formed from a metallic surfaced foil. Although certain applications may require a thin oxide layer and/or a series of base contacts prior to application of the amorphous material, for purposes of this application, the term "substrate" shall include not only a flexible film, but also any elements added thereto by preliminary processing. Most commonly the substrate material 11 may be stainless steel, aluminum, tantalum, molybdenum or chrome.

Each of the cells 12a, 12b and 12c are fabricated with an amorphous alloy body containing at least a silicon alloy. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although tandem p-i-n cells are illustrated, the gas gates of this invention are equally adapted for use in multiple chamber apparatus which is adapted to produce tandem n-i-p cells by simply reversing the order of depositing the n-type and p-type layers onto the substrate.

For each of the cells 12a, 12b and 12c, the p-type layers are characterized by light absorptive, high conductivity alloy layers. The intrinsic alloy layers are characterized by an adjusted wavelength threshold for solar photoresponse, high light absorption, low dark conductivity and high photoconductivity, including sufficient amounts of a band gap adjusting element or elements to optimize the band gap for the particular cell application. Preferably, the intrinsic layers are band gap adjusted to provide cell 12a with the lowest band gap, cell 12c with the highest band gap, and cell 12b with a band gap between the other two. The n-type layers are characterized by low light absorption, high conductivity alloy layers. The thickness of the n-type layers can be in the range of about 25 to 100 angstroms. The thickness of the band gap adjusted, amorphous intrinsic alloy layers can be between about 2,000 to 3,000 angstroms. The thickness of p-type layers can be between 50 to 200 angstroms. Due to the shorter diffusion length of the holes, the p-type layers generally will be as thin as possible. Further, the outermost layer, here the n-type layer 20c, will be as thin as possible to avoid absorption of light and need not include the band gap adjusting element.

It is to be understood that following the deposition of the semi-conductor alloy layers, a further deposition step may be either performed in a separate environment or as a part of the continuous production apparatus. In this step, a TCO (transparent conductive oxide) layer 22 is added, which layer may, for example, be indium tin oxide (ITO), cadmium stannate ($Cd_2SnO_4$), or doped tin oxide ($SnO_2$). Although an electrode grid 24 may be added to the device, for a tandem cell having a sufficiently small area, the TCO layer 22 is generally sufficiently conductive so the grid 24 is not necessary. If the tandem cell is of a sufficiently large area, or if the conductivity of the TCO layer 22 is insufficient, the grid 24 may be placed on the layer 22 to shorten the carrier path and increase the conduction efficiency thereof.

II. The Multiple Glow Discharge Deposition Chambers

Figure 2:
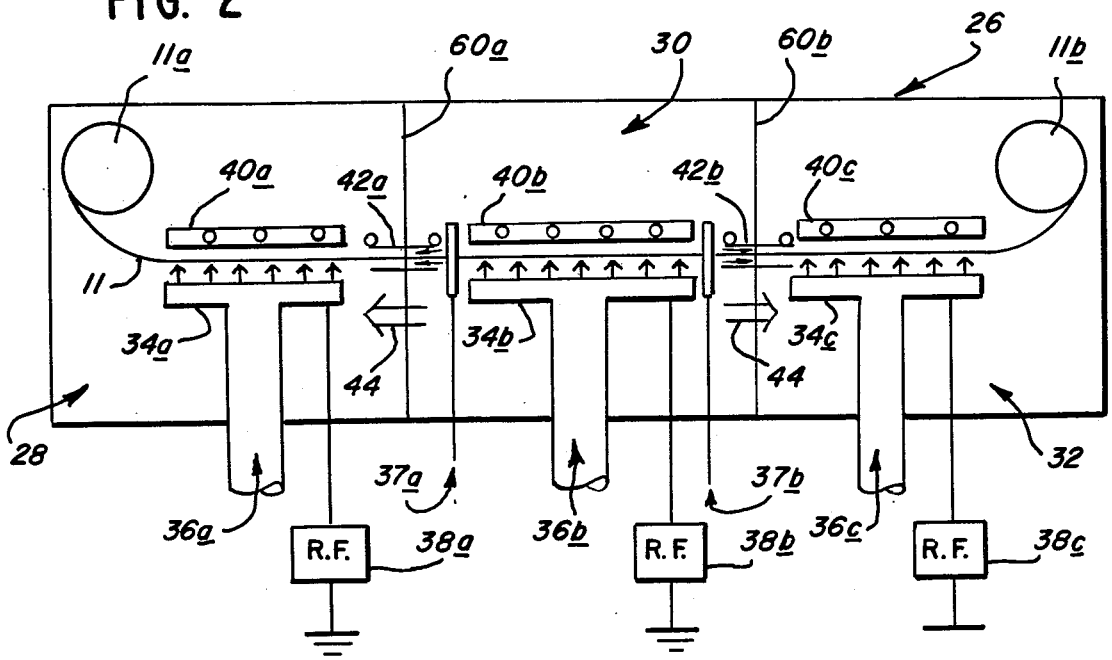
FIG. 2 is a diagrammatic representation of a multiple glow discharge chamber deposition system adapted for the continuous production of the photovoltaic devices shown in FIG. 1, which system includes gas gates for substantially isolating each deposition chamber from each adjacent deposition chamber.

Turning now to FIG. 2, a diagrammatic representation of a multiple glow discharge chamber deposition apparatus for the continuous production of the tandem photovoltaic cells, previously described, is generally illustrated by the reference numeral 26. The apparatus 26 includes a plurality of isolated, dedicated deposition chambers, each chamber being interconnected by a gas gate in accordance with the principles of the present invention.

The apparatus 26 is adapted to produce a high volume of large area, amorphous photovoltaic cells having a p-i-n configuration on the deposition surface of a substrate material 11 which is continually fed therethrough. To deposit the amorphous alloy layers required for producing a tandem cell of the p-i-n configuration, the apparatus 26 includes at least one triad of deposition chambers, each triad comprising: a first deposition chamber 28 in which a p-type conductivity amorphous alloy layer is deposited onto the deposition surface of the substrate 11 as the substrate 11 passes therethrough; a second deposition chamber 30 in which an intrinsic amorphous alloy layer is deposited atop the p-type alloy layer on the deposition surface of the substrate 11 as the substrate 11 passes therethrough; and a third deposition chamber 32 in which an n-type conductivity alloy layer is deposited atop the intrinsic layer on the deposition surface of the substrate 11 as the substrate 11 passes therethrough.

It should be apparent that: (1) although one triad of deposition chambers has been described, additional triads or additional individual chambers may be added to the machine to provide the machine with the capability of producing photovoltaic cells having any number of amorphous layers; (2) the gas gates of the present invention find application in an environment with as few as two adjacent chambers wherein prevention of backflow or cross-contamination of gases between those chambers is required; (3) although in the preferred embodiment, the substrate material is shown and described as a continuous web of magnetic material, the concept of the present invention may be adapted for depositing successive layers atop discrete magnetic substrate plates which can be continuously fed through the plurality of deposition chambers; (4) since the length of the path of travel of the substrate through individual deposition chambers is proportional to the thickness of the p-type or intrinsic or n-type layer deposited in a given chamber, the length of the path of travel of the substrate through an individual deposition chamber may be increased or decreased to deposit a layer of desired thickness onto the substrate; and (5) although not shown, other chambers (such as a chamber for adding a TCO layer atop the uppermost dopant layer of the photovoltaic device) may be operatively connected to the glow discharge apparatus 26 by the magnetic gas gate of the present invention.

Where the apparatus 26 is employed to produce tandem p-i-n or n-i-p-type photovoltaic cells, additional triads of deposition chambers are operatively connected to the triad of deposition chambers shown in FIG. 2. In those instances, the apparatus 26 would further include an intermediate chamber (not shown) for isolating the n-type reaction gas mixture flowing through the third deposition chamber 32 and the p-type reaction gas mixture flowing through the first deposition chamber of the succeeding triad.

Each deposition chamber 28, 30 and 32 of the triad is adapted to deposit a single amorphous silicon alloy, by glow discharge deposition onto the magnetic substrate 11. To that end, each of the deposition chambers 28, 30 and 32 includes: a cathode 34a, 34b and 34c, respectively; a gas supply conduit 36a, 36b and 36c, respectively, a radio frequency generator 38a, 38b and 38c, respectively; and a plurality of radiant heating elements 40a, 40b and 40c, respectively.

The supply conduits 36a–36c are operatively associated with the respective cathodes 34a–34c to deliver reaction gas mixtures to the plasma regions created in each deposition chamber 28, 30 and 32 between said cathodes and the substrate 11 traveling therepast. Although the supply core 11a of magnetic substrate material 11 is shown rotatably positioned in the first deposition chamber 28 and the take-up core 11b of substrate material is shown rotatably positioned in the third deposition chamber 32, it is to be understood that the supply core 11a and take-up core 11b may be positioned in other chambers operatively connected to the illustrated triad of chambers without departing from the spirit or scope of the present invention.

The radio frequency generators 38a–38c operate in conjunction with the cathodes 34a–34c, the radiant heaters 40a–40c and the grounded substrate 11 to form the plasma regions by dissociating the elemental reaction gases entering the deposition chambers 28, 30 and 32 into deposition species. The deposition species are then deposited onto the substrate 11 as amorphous silicon alloy layers.

To form the photovoltaic cell 10 illustrated in FIG. 1, a p-type amorphous silicon layer is deposited onto the substrate 11 in the deposition chamber 28, an intrinsic amorphous silicon alloy layer is deposited atop the p-type layer in the deposition chamber 30 and an n-type amorphous silicon alloy layer is deposited atop the intrinsic layer in the deposition chamber 32. As a result, the apparatus 26, deposits at least three amorphous silicon alloy layers onto the substrate 11 wherein the intrinsic layer deposited in deposition chamber 30 differs in composition from the layers deposited in deposition chambers 28 and 32 by the absence of at least one element which will be referred to as the dopant or doping species.

It is essential that the alloy layers deposited onto the magnetic substrate 11 be of high purity in order to produce photovoltaic devices 10 of correspondingly high efficiency. It is therefore necessary to provide means for isolating the intinsic deposition chamber 30, which has introduced thereinto only intrinsic gases for forming the intrinsic alloy layer, from the dopant deposition chambers 28 and 32 wherein the doping species gases are introduced. Although the isolation must be sufficient to provide a ratio of at least $10^3$ in the concentration of the intrinsic gases in the deposition chamber 30 to the doping species gases in the dopant deposition chamber 28 and 32, the greater the isolation, the more efficient the device.

III. The Gas Gates

In accordance with the present invention, the necessary isolation of the intrinsic gases in the intrinsic deposition chamber 30 from the doping species gases in the dopant deposition chaxbers 28 and 32 is, in part, accomplished by establishing a unidirectional flow (in the direction of arrow 44) from the intrinsic deposition chamber 30 into either of the dopant deposition chambers 28 and 32. As is readily apparent from FIG. 2, the intrinsic deposition chamber 30 is in operative communication with the dopant deposition chambers 28 and 32 by gas gates, illustrated as slots 42a and 42b, which are dimensioned to permit the substrate 11 to travel through a passageway therein as it continuously moves from the supply core 11a, through the deposition chambers 28, 30 and 32, and onto the take-up core 11b. Heretofore, dimensions of the gas gates 42a and 42b were selected to be as small as possible to prevent back diffusion or backflow of the doping species gases from the dopant deposition chambers 28 and 32 into the intrinsic deposition chamber 28, while the dimensions were simultaneously selected to be sufficiently large to permit the layered substrate surface to pass therethrough without being scratched by the passageway walls. Therefore, the design of the gas gates such as 42a and 42b involves a balancing of interests. The passageway through the gas gates must be large enough to permit (1) contact-free passage of the layered surface of the substrate 11 therethrough, and (2) prevent diffusion or backflow of reaction gases from the intrinsic deposition chamber 30 therethrough. It is toward the goal of minimizing the size of the gas gate passageway without scratching the layered substrate surface that the present invention is directed. It must once again be noted that, although this application relates predominantly to the prevention of contamination of the intrinsic alloy layer by dopant alloy constituents, the dopant alloy layers may also be protected from contamination by employing the magnetic gas gate of the present invention to operatively connect the dopant deposition chambers and adjacent chambers in which, for instance, (1) a TCO layer is deposited atop the uppermost dopant layer, or (2) the magnetic substrate material is cleaned prior to entering the deposition chambers. The utilization of the magnetic gas gate will also operate to help prevent waffling of the substrate in these other chambers.

In order to prevent diffusion of the intrinsic reaction gases from the intrinsic deposition chamber 30 to the dopant deposition chambers 28 and 32 through the gas gates 42a and 42b, the p-dopant deposition chamber 28 and the n-dopant deposition chamber 32 are maintained at a lower internal pressure than the intrinsic deposition chamber 30. To that end, each deposition chamber may be provided with automatic throttle valves, pumps, and manometers (not illustrated). Each throttle valve is operatively connected to a respective deposition chamber and to a respective pump so as to evacuate excess and spent deposition constituents from the deposition chambers. Each absolute manometer is operatively connected to a respective deposition chamber and a respective one of the throttle valves for controlling the pressure within said deposition chambers. More particularly the pressure within the dopant deposition chambers 28 and 32 is preferably maintained at approximately 0.55 torr and the pressure within the intrinsic deposition chamber 30 is preferably maintained at approximately 0.6 torr. Hence, a pressure differential is established and maintained between the dopant deposition chambers 28 and 32 and the intrinsic deposition chamber 30 to provide for substantially unidirectional gas flow through the intrinsic deposition chamber 30.

In accordance with the preferred embodiment of the present invention, the intrinsic gases include the intrinsic starting materials from which the three deposited amorphous silicon alloy layers are derived. For example, the intrinsic starting gases can include silicon tetrafluoride gas ($SiF_4$) plus hydrogen gas, silicon tetrafluoride gas plus silane gas ($SiH_4$), silicon tetrafluoride gas alone, or silane gas alone. The intrinsic starting material gases are delivered into conduit 36b and thus into the intrinsic deposition chamber 30 at a rate which, in cooperation with the rate at which sweep gas is introduced, assures (1) the unidirectional flow through the gas gates 42a and 42b, (2) sustains the intrinsic gases in the dopant deposition chambers 28 and 32, and (3) substantially prevents backflow or diffusion of the dopant gases into the intrinsic deposition chamber 30.

The doping species gases required to produce the p or n-type alloy layers in the dopant deposition chambers 28 and 32 are introduced, respectively, through the conduits 36a and 36c. The concentration of doping species gases required in the p-dopant deposition chamber 28 to produce the p-type alloy layer is about 0.1 atomic percent. That doping species gas may be, for example, boron introduced in the form of diborane gas ($B_2H_6$). For producing a p-type alloy layer having an increased band gap, elements such as nitrogen, carbon, or oxygen may also be introduced.

The concentration of doping species gases required in the n-dopant deposition chamber 32 to produce the n-type alloy layer is about 0.005 atomic percent. That doping species gas may be, for example, phosphorous introduced as phosphine gas or arsenic introduced as arsine gas.

In the preferred embodiment, a sweep gas such as hydrogen, argon, or another inert gas is introduced at the leading side (the intrinsic deposition chamber side) of the gas gates 42a and 42b. The sweep gas enters the intrinsic chamber 30 adjacent said gas gates 42a and 42b through conduits 37a and 37b, respectively, which conduits 37a and 37b include apertures (not shown) for directing the sweep gas on both sides of the magnetic web of substrate material 11. Due to the pressure differential between the dopant chambers 28 and 32 and the intrinsic chamber 30, the inert gases are unidirectionally swept across the passageway 43 of the gas gates 42a and 42b. A substantial percentage of the intrinsic reaction gases introduced into the intrinsic chamber 30 through conduit 36b are preferably restricted to the plasma region of the chamber 30 by introducing and withdrawing the gases adjacent said region. In a like manner a substantial percentage of the reaction gas constituents necessary to deposit doped layers are introduced into the dopant chambers 28 and 32 through conduits 36a and 36c, respectively. The dopant gases are also substantially restricted to the respective plasma regions of the dopant chambers by introducing and withdrawing those reaction gas mixtures adjacent said regions. After the inert gases are drawn through the gas gates 42a and 42b into the respective dopant deposition chambers 28 and 32, respectively, said inert gases may either be substantially withdrawn adjacent the terminal (the dopant chamber) side of the gas gates 42a and 42b or may be evacuated with the dopant reaction gases. In either event, the sweep gases serve as an additional measure to substantially prevent the backflow or diffusion of dopant gases from the dopant deposition chambers 28 and 32 into the intrinsic deposition chamber 30.

Figure 3:
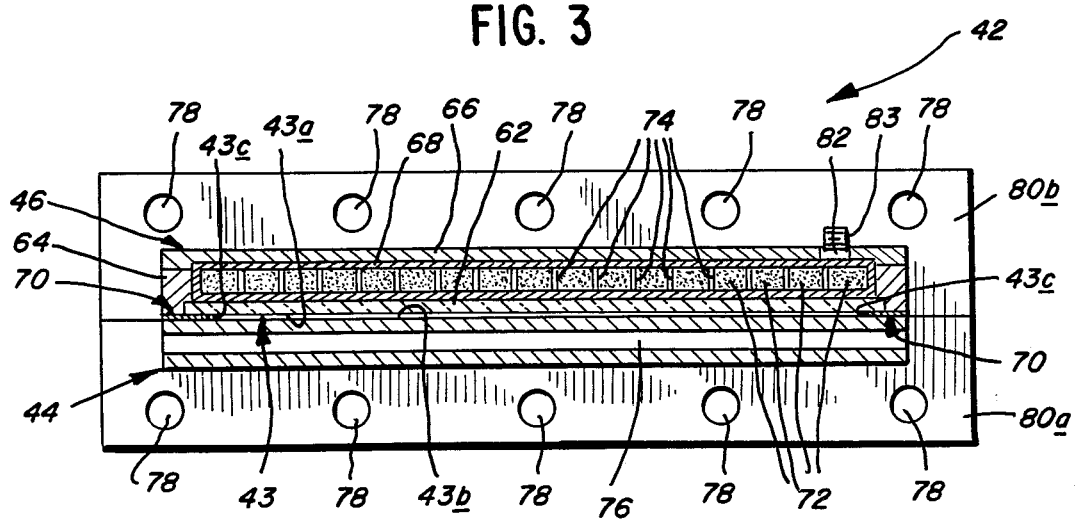
FIG. 3 is a cross-sectional view of a gas gate of the instant invention illustrating the arrangement of the ceramic magnets within a recess in the upper block of the gas gate, the magnets adapted to develop the magnetic field in accordance with the basic principles of the present invention.
Figure 4:
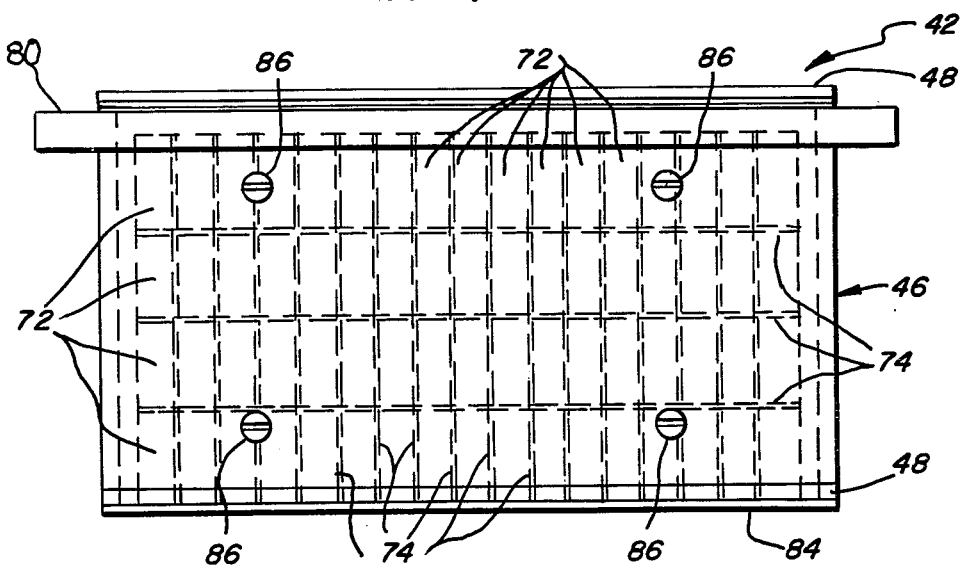
FIG. 4 is a top plan view of the gas gate of FIG. 3 showing in phantom lines the separators which help create the magnetic field beneficially utilized in the present invention.

FIG. 3 is an enlarged cross-sectional view of the preferred gas gate configuration, indicated generally by the reference numberal 42. The gas gate 42 of FIG. 3 is intended to be only symbolic of the general arrangement of known parts in a typical gas gate and is in no way intended to depict all of the known structural elements of that gas gate. The description is fully detailed only with respect to the magnetic elements which form the essence of the instant invention.

More particularly, the gas gate 42 generally comprises a lower block 44 and an upper block 46 to the leading edge of which a transversely elongated cylindrical roller assembly 48 is secured. The length of the cylindrical roller assembly 48 is preferably at least as wide as the width of the magnetic web of substrate material 11 passing through the multiple chamber apparatus 26 so that the entire width of the substrate 11 contacts a portion of the circumference of the cylindrical roller surface. A plurality of roller bearings may be provided for substantially frictionless rotation of the cylindrical roller assembly 48. The cylindrical roller assembly 48 is adapted to guide the magnetic web of substrate material 11 through a relatively narrow slot or passageway 43 formed between the top surface of the lower gas gate block 44 and a cut-out portion of the upper gas gate block 46. By establishing a unidirectional flow of the inert sweep gas from the intrinsic deposition chamber side of the gas gate into the adjacent dopant deposition chambers side of the gas gate, substantial contamination of the intrinsic deposition chamber 30 caused by the backflow or diffusion of p-type and n-type dopant gases introduced into the adjacent deposition chambers 28 and 30, respectively, is prevented. Although the preferred embodiment employs a single roller assembly 48 rotatably secured adjacent the forward end of the gas gate 42, a second roller assembly could also be rotatably secured to the tail end of the gas gate to provide further guidance for the web of substrate material 11.

The gas gate slit or passageway 43 is generally rectangular in cross-sectional configuration and is defined by an upper wall 43a, a lower wall 43b and two side walls 43c. As previously mentioned, it is desirable that the walls 43c be as short as possible to minimize the backflow or diffusion of gases through the passageway 43. To accomplish that objective, the upper wall 43a of the passageway 43 is fabricated from a relatively hard material exhibiting the further characteristics of low frictional surface resistance and low thermal conductivity. In the preferred embodiment, a tempered glass sheet 62 such as "PYREX" (registered trademark of Corning Glass Works for a borosilicate glass having a softening temperature of 820° C., an upper working temperature in normal service of 230° C. and a scleroscope hardness of 120) exhibits the required characteristics and is therefore used to fabricate that upper passageway wall 43a. Although, in the preferred embodiment, it is the upper wall 43a that is formed of a material having low friction surface resistance and low thermal conductivity, (because it is the surface of the upper wall 43a which contacts the unlayered side of the substrate 11), the lower wall 43b could also be so formed (if the layers were deposited on the upper surface of the substrate 11) without departing from the spirit or scope of the present invention. As a further preferred embodiment, the magnetic gas gate of the present invention is also adaptable for use with a vertically oriented cathode assembly (rather than the horizontal cathode illustrated herein). With a vertical cathode assembly, either wall of the gas gate could be formed of a low frictional and low thermal conductivity material without departing from the scope of this invention.

Figure 5:
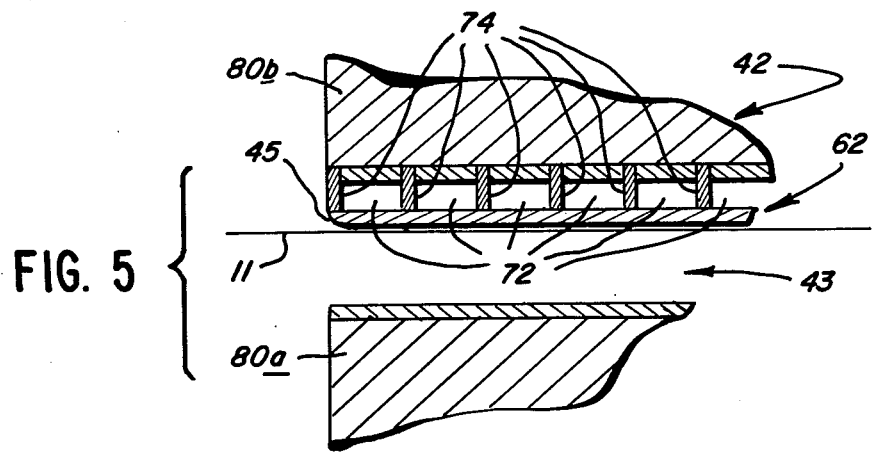
FIG. 5 is a diagrammatic representation of a web of substrate material traveling through the gas gate passageway of the present invention and illustrating the configuration of the upper gas gate wall.

Referring now to FIG. 5, the magnetic web of substrate 11 is diagrammatically illustrated traveling through the passageway 43 of a gas gate such as 42. More particularly, FIG. 5 depicts the web of substrate material 11 in sliding contact with the upper glass wall 43a of the passageway 43. Of particular note is the small radius of approximately ⅛ inch which may be formed at the leading edge of the upper glass wall 43a. The purpose of the radius 45 is to further prevent the leading edge of the wall 43a from cutting the web of substrate material 11.

As previously deescribed, with reference to FIG. 3 the passageway 43 is partially formed by a recess 64 in the upper block 46 into which are secured a plurality of elements adapted to urge the substrate 11 into sliding contact with the lower surface of the glass sheet 62. In more detail, a one-fourth (¼) inch thick by sixteen and one-half (16½) inch wide by seven and one-half (7½) inch deep aluminum plate 66 is first placed into the recess 64; a 304 stainless steel, sixteen (16) inch wide by eight (8) inch deep by three-eighths (⅜) inch thick enclosure 68 is then placed in the recess 64 to abut the aluminum plate 66; and finally, the one-fourth (¼) inch thick by sixteen (16) inch wide by eight (8) inch deep glass plate 62 is placed into the recess 64 to abut the enclosure 68. A pair of elongated, one-eighth (⅛) inch spacers 70 (1) from the side walls 43c of the passageway 43, and (2) develop and fix the depth of the passageway opening. It should be noted that, although the preferred height of the spacers is one-eighth (⅛) inch, the height dimension has, in practice, been reduced to a value as small as one-sixteenth (1/16) inch. However, in order to practically use a one-sixteenth (1/16) inch passageway, it would be necessary to employ a very high quality magnetic web of substrate material so as to provide very uniform thickness. Nonetheless, the preferred height dimension of one-eighth (⅛) inch represents a very significant reduction in the passageway opening since previous openings were no smaller than approximately one-fourth (¼) inch. As should be readily apparent, as the depth dimension decreases, the amount of dopant gases backflowing or diffusing through the passageway 43 from the dopant deposition chambers 28 and 32 is correspondingly reduced. It has been determined that a decrease in the passageway opening from the previous one-fourth (¼) inch dimension to the one-sixteenth (1/16) inch value, which is made possible by the instant invention, results in a decrease of contaminants backflowing or diffusing from the p-dopant deposition chamber 28 or the n-dopant deposition chamber 32 into the intrinsic deposition chamber 30 by at least a factor of one-hundred (100).

From the foregoing discussion, the importance of forming the upper wall 43a of the passageway 43 from a material which will remain substantially planar at the elevated operating temperatures and temperature variations required for deposition, is apparent. If the surface of the upper wall 43a was inherently capable of warping with fluctuations of temperature: (1) portions of the layered surface of the magnetic substrate 11 would contact the lower wall 43b of the passageway 43 as it traveled therethrough, thereby causing one or more amorphous layers deposited thereon to become scratched or otherwise marred causing the efficiency of a photovoltaic device produced therefrom to be correspondingly affected; and (2) the magnetic substrate 11, being drawn against the upper wall 43a, would conform to the surface thereof, possibly resulting in an undulated or buckled substrate configuration onto which uneven semiconductor layers would be deposited, which would also reduce the efficiency of the photovoltaic device. Accordingly, it is yet a further necessary characteristic that the material from which the upper wall 43a is formed, be relatively hard so as to remain substantially planar under elevated operating temperatures.

Inside the stainless steel enclosure 68, a plurality of ceramic magnets such as 72 are arranged in rows and columns by a plurality of horizontally and vertically arranged magnet separators 74. The magnets 72 are preferably fashioned from ceramic material because ceramic materials form lightweight, relatively inexpensive magnets which are stable at elevated temperatures and create a strong magnetic field. Although the magnets 72 are shown in the preferred embodiment as one (1) inch wide by two (2) inch long rectangular ceramic bars, the magnets 72 are not limited either to ceramic materials or to any particular dimension or configuration. It is only necessary that the magnets 72 be capable of providing a strong magnetic field at the elevated operating temperatures used for deposition. It is preferable that a plurality of bar magnets be used to create the total magnetic field. This is because the greatest magnetic flux is developed at the ends of the bar magnets 72 and therefore the more magnets used, the greater the attractive force and the more uniform the magnetic field.

The magnetic separators 74 are substantially flat, elongated, non-magnetic elements, such as one-sixteenth (1/16) inch thick aluminum plates. The separators 74 cooperate with the plurality of magnets 72 to enhance the uniformity of the magnetic field. In the preferred embodiment, a total of sixty-four (64) one (1) inch by two (2) inch ceramic magnets 72 are so spaced by non-magnetic separators 74 that the ends of the peripheral magnets 72 terminate coincidentally with the edge of the magnetic web of substrate material 11 traveling through the passageway 43. By so arranging the magnets 72 relative to the magnetic substrate 11, the inventive concept disclosed herein offers the additional benefit of using the magnetic field to center the substrate 11 as it travels through the gas gate 42. The upper block 46 includes a two-piece retainer 84 adapted to hold the magnets 72 and separators 74 in the prearranged pattern. The top portion of the retainer 84 cooperates with the side portion thereof by a plurality of screws 86.

There is still a further noteworthy advantage achieved by the magnetic gas gate 42, described above. The cylindrical roller assembly 48 is rotatably supported to position the web of substrate material 11 traveling through the passageway 43 of the gas gate 42 approximately 0.020 inches below the upper passageway wall 43a. Despite the fact that the substrate 11 is maintained under tension, the substrate 11 displays the undesirable inherent tendency to buckle or canoe due to the elevated operating temperatures to which it is subjected, thereby creating the possibility of having non-uniform layers deposited thereonto. By developing a magnetic field as suggested by the present invention, at least some of the "slack" in the web of substrate material 11 is relieved (the substrate 11 is pulled upwardly by the magnetic field to contact the upper passageway wall 43a), the added tension substantially reducing buckling of the web of substrate material 11 which thereby permits uniform layers to be deposited thereonto.

The top surface of the lower block 44 of the gas gate 42 forms the lower wall 43b of the passageway 43. Also machined into the lower block 44 are a plurality of bores 76 for receiving therein elongated heating elements (not shown), the exact number of which depends on the power of each element and the desired temperature at which the substrate 11 is to be maintained as it passes through the passageway 43. Both the lower block 44 and the upper block 46 of the gas gate 42 include a plurality of apertures 78 in panels 80a and 80b, respectively, which are used to mount the gas gate 42 to the deposition chambers. Further, a port 82 provides access into the upper block 46 and the aluminum plate 66 for establishing communication with the recess 64. In this manner, the recess 64 can be pumped after the magnetic gas gate apparatus is inserted thereinto and the port 82 can be sealed by plug 83 to prevent contamination of the deposition chambers by the ceramic magnets 72.

IV. The Operation

In operation, the magnetic web of substrate material 11 is directed, under tension, from the supply core 11a through: (1) the p-dopant deposition chamber 28 wherein a p-alloy layer, such as 16a, is deposited onto the underside of the web; (2) the first gas gate 42a; (3) the intrinsic deposition chamber 30 wherein an intrinsic alloy layer, such as 18a, is deposited onto the p-layer; (4) the second gas gate 42b; (5) the n-dopant deposition chamber 32 wherein an n-alloy layer, such as 20a, is deposited onto the intrinsic layer; and (5) finally wound onto the take-up core 11b. The gas gates 42a and 42b operatively connect dopant deposition chambers adjacent to the intrinsic deposition chamber 30, while also preventing the backflow or diffusion of reaction gases from the p-dopant deposition chamber 28 and n-dopant deposition chamber 32 into the intrinsic deposition chamber 30. If additional processes, such as the application of a TCO layer 22 atop the dopant layer 20c, are performed in additional chambers operatively connecting the triad of deposition chambers 28, 30 and 32, the improved gas gates 42 of the present invention will also be employed between these additional chambers and adjacent deposition chambers to reduce (1) contamination of the dopant deposition chambers and (2) waffling of the magnetic substrate material 11.

The magnetic field developed by the ceramic magnets 72 of the present invention operates to urge the unlayered side of the magnetic web of substrate material 11 (fabricated from a material such as 430 stainless steel) traveling through the passageway 43 in the gas gate 42 into sliding contact with the surface of the upper wall 43a. Since the upper wall 43a is fabricated from a low friction, low thermal conductivity, relatively hard material, such as a "PYREX" (trademark of Corning Glass Works) glass sheet, the underside of the substrate will not be deleteriously affected. The ceramic magnets 72 develop a uniform magnetic field with very strong forces in a direction perpendicular to the planar surface of the substrate 11 traveling through the passageway 43, but relatively weak forces in a direction parallel to said planar substrate surface. The magnetic web of substrate material 11 is thereby simultaneously (1) pulled against the surface of the glass sheet 43a, while being (2) permitted to slide thereagainst as it passes through the passageway 43.

The magnets 72, by urging the magnetic substrate 11 into sliding contact with the specially fabricated upper wall 43a of the passageway 43, permit a reduction in the width of the passageway opening. In other words, special tolerances to prevent scratching of the unlayered substrate surface become unnecessary, and, as the width of the passageway opening is reduced, the backflow or diffusion of dopant gases from the dopant deposition chambers is correspondingly reduced, thereby substantially decreasing contamination of the intrinsic layer and producing a more efficient photovoltaic device.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

We claim:

1. An improved gas gate for substantially reducing the backflow of gases from one dedicated chamber to an adjacent dedicated chamber, the gas gate including two spaced walls defining a relatively narrow passageway through which a substrate moves from the first of said adjacent dedicated chambers wherein a first layer is deposited onto one side of said substrate to the second of said deposition chambers wherein a second layer is deposited onto the first layer; said first chamber including means for introducing at least one gas thereinto; said second chamber including means for introducing at least one additional gas thereinto; and means associated with said chambers for evacuating the gases from said chambers; said improved gas gate including, in combination:

the substrate formed of a magnetically attractable material; and magnetic means for urging the unlayered side of the magnetically attractable substrate traveling through the passageway into sliding contact with one of said passageway walls, whereby the distance between said passageway walls may be decreased without bringing the layered substrate surface into contact with the other of said passageway walls so as to reduce the backflow of gases from the second chamber through the gas gate passageway.

2. An improved gas gate as in claim 1, wherein the passageway wall which contacts the unlayered side of the substrate is fabricated from a low friction, low thermal conductivity material.

3. An improved gas gate as in claim 2, wherein the substrate contacting wall is a borosilicate glass sheet.

4. An improved gas gate as in claim 1, wherein the magnetic means comprises a plurality of ceramic magnets.

5. An improved gas gate as in claim 4, wherein the ceramic magnets are separated by a plurality of nonmagnetic spacers.

6. An improved gas gate as in claim 1, wherein the dedicated adjacent chambers are adapted to deposit semiconductor layers onto the magnetically attractable substrate.

7. An improved gas gate adapted to operatively interconnect each pair of at least two adjacent deposition chambers; said gas gate including two spaced walls defining a relatively narrow passageway through which a web of substrate material may be continuously advanced from a first deposition chamber wherein a first semiconductor layer is deposited onto one side of said substrate to the adjacent deposition chamber wherein a second semiconductor layer is deposited onto the first layer; the improved gas gate including:

a web of substrate material formed from a magnetically attractable material;

means adapted to create a magnetic field for urging the unlayered side of the magnetically attractable web of substrate material traveling through the passageway into sliding contact with one of said passageway walls, whereby the distance between said passageway walls may be decreased without bringing the layered surface of the web of substrate material traveling through the passageway into contact with the other of said passageway walls.

8. An improved gas gate as in claim 7, wherein the passageway wall which contacts the unlayered side of the substrate is a borosilicate glass sheet; and a uniform magnetic field is created by a plurality of ceramic magnets.

9. An improved gas gate as in claim 7, wherein an amorphous intrinsic semiconductor material is deposited in one of the chambers, and a doped semiconductor material is deposited in the other chamber.

10. An improved gas gate as in claim 7, including at least three deposition chambers; a gas gate interconnecting each of the first and second chambers and the second and third chambers, whereby an intrinsic semiconductor layer may be deposited in the second chamber and doped semiconductor layers of opposite conductivities may be deposited in the first and third chambers.

11. An improved gas gate for substantially reducing the backflow of gases from one deposition chamber to an adjacent deposition chamber, the gas gate including two spaced, generally planar, transversely elongated walls defining a relatively narrow, elongated passagway through which a substrate moves from the first of said adjacent deposition chambers wherein a first layer is deposited onto one side of said substrate, to the second of said deposition chambers wherein a second layer is deposited atop the first layer; said first chamber including means for introducing at least one gas thereinto; said second chamber including means for introducing at least one additional gas thereinto; and means associated with said chambers for evacuating the gases from said chambers; said improved gas gate including in combination:

said substrate adapted to assume a substantially planar path of travel through the passageway;

said gas gate including means for urging the unlayered side of said substrate traveling through the passageway into sliding contact with one of said passageway walls, said urging means associated with the wall of the passageway toward which the substrate is urged and adapted to act on said substrate at at least one passageway location intermediate the adjacent deposition chambers, whereby the distance between said passageway walls may be decreased without bringing the layered substrate surface into contact with the other of said passageway walls, so as to reduce the backflow of gases from the second chamber through the gas gate passageway.

12. A gas gate as in claim 11, wherein the gases introduced into each of the chambers include a semiconductor material.

13. A gas gate as in claim 11 wherein the substrate is formed of a magnetically attractable material and the means for urging the substrate into sliding contact with one of said passageway walls comprises a magnetic field generating means.

* * * * *